United States Patent
Mikami et al.

[11] Patent Number: 5,334,250
[45] Date of Patent: Aug. 2, 1994

[54] VAPOR DEPOSITION APPARATUS FOR USING SOLID STARTING MATERIALS

[75] Inventors: Akiyoshi Mikami, Yamatotakada; Takashi Ogura, Nara; Kousuke Terada, Tenri; Masaru Yoshida, Nara; Takuo Yamashita, Tenri; Koichi Tanaka, Nara; Katsushi Okibayashi, Sakurai; Shigeo Nakajima, Nara; Hiroaki Nakaya, Tenri; Kouji Taniguchi, Nara, all of Japan

[73] Assignee: Sharp Kabushiki Kaisha, Osaka, Japan

[21] Appl. No.: 22,742

[22] Filed: Feb. 17, 1993

Related U.S. Application Data

[63] Continuation of Ser. No. 594,138, Oct. 10, 1990, abandoned.

[30] Foreign Application Priority Data

Nov. 2, 1989 [JP] Japan .................. 1-286454

[51] Int. Cl.⁵ .......................................... C23C 16/44
[52] U.S. Cl. .................. 118/724; 118/715; 118/726; 118/728; 118/730; 427/255.2
[58] Field of Search .............. 118/715, 724, 725, 726, 118/728, 730; 156/610, 611, 613, 614; 148/DIG. 169; 427/255.2

[56] References Cited

U.S. PATENT DOCUMENTS

| | | | |
|---|---|---|---|
| 3,098,763 | 7/1963 | Deal et al. | 118/724 |
| 3,310,425 | 3/1967 | Goldsmith | 156/614 |
| 3,424,629 | 1/1969 | Ernst et al. | 118/730 |
| 3,858,548 | 1/1975 | Tick | 118/724 |
| 4,487,640 | 12/1984 | Erstfeld | 156/610 |
| 4,509,456 | 4/1985 | Kleinert et al. | 118/715 |
| 4,747,928 | 5/1988 | Takahashi et al. | 414/225 |
| 4,848,273 | 7/1989 | Mori et al. | 118/715 |
| 4,854,266 | 8/1989 | Simson et al. | 118/728 |
| 4,886,412 | 12/1989 | Wooding et al. | 414/416 |

FOREIGN PATENT DOCUMENTS

| | | | |
|---|---|---|---|
| 0342063 | 11/1989 | European Pat. Off. | |
| 3216465 | 3/1983 | Fed. Rep. of Germany. | |
| 54-4566 | 1/1979 | Japan | 156/610 |
| 54-69062 | 6/1979 | Japan | 156/614 |
| 59-207622 | 11/1984 | Japan | 118/730 |
| 60-65526 | 4/1985 | Japan | 156/610 |
| 60-215594 | 10/1985 | Japan. | |
| 60-253212 | 12/1985 | Japan. | |
| 61-101021 | 5/1986 | Japan | 118/728 |
| 62-91496 | 4/1987 | Japan. | |
| 63-35776 | 2/1988 | Japan | 118/715 |
| 1-108744 | 4/1989 | Japan | 118/726 |

OTHER PUBLICATIONS

Prabhu, R. S., "Chemical Vapor Depositon of Molybdenum", IBM Technical Disclosure Bulletin, vol. 13, No. 9 (Feb. 1971) p. 2535.

*Primary Examiner*—Terry J. Owens
*Attorney, Agent, or Firm*—Birch, Stewart, Kolasch & Birch

[57] ABSTRACT

A vapor deposition apparatus for depositing thin film on substrates in which solid starting materials are used. In this apparatus, a carrier gas flows up and down in the same direction as gas convection, such that the effect of gas convection is minimized and film thickness and impurity concentration are uniform over the substrate surface. This uniformity is achieved by orienting a main reaction tube in a vertical direction, attaching two branch reaction tubes at the top of the main reaction tube, and venting carrier gas out the bottom of the main reaction tube. Alternately, the main reaction tube can be oriented horizontally, with the substrates being carried on a holder within a container having pores on its top and bottom.

5 Claims, 3 Drawing Sheets

[B] Mn concentration distribution (at %)

(d) 0.47   (a) 0.49

(e) 0.45   (b) 0.53

(f) 0.47   (c) 0.49

[A]   Film thickness distribution (Å)

(d) 6850   (a) 6780

(e) 6770   (b) 6810

(f) 6790   (c) 6800

VAPOR DEPOSITION APPARATUS FOR USING SOLID STARTING MATERIALS

This application is a continuation of application Ser. No. 07/594,138 filed on Oct. 10, 1990, now abandoned.

FIELD OF THE INVENTION

The present invention relates to a vapor deposition apparatus which can form a semiconductor or insulation thin film on a large area substrate in large quantities.

BACKGROUND OF THE INVENTION

A method for producing a semiconductor thin film for electronic devices of ZnS, GaAs, Si etc. or an insulating thin film of $Ta_2O_5$, $Al_2O_3$ etc. includes a vapor deposition method wherein starting materials of the thin film are vaporized and transferred onto a substrate. If a vapor pressure of the starting materials is low at room temperature, i.e. less than about 1 torr, the starting materials may be heated or chemically reacted with a reactive carrier gas to promote vaporization.

For example, if an electroluminescent (EL) film is prepared from ZnS and Mn by a heat chemical vapor deposition (CVD) method, a horizontal type vapor growth apparatus as shown in FIG. 3 is generally employed. In this apparatus, a reaction tube 1 includes two reaction tubes 2a and 2b and is surrounded with electric heaters 3a, 3b and 3c. A starting material ZnS 11 is placed in the reaction tube 2a and a metal (Mn) material 12 is placed in the reaction tube 2b. Substrates 10 are put on a holder and placed a little apart from the reaction tubes 2a and 2b. A baffle 4 for promoting the mixing of gas is arranged between the substrates 10 and the reaction tubes 2a and 2b. The electric heaters 3b and 3c heat to a desired temperature the reaction tubes 2a and 2b into which a carrier gas is introduced and starting material gas is transferred onto the substrate through the baffle 4 to form a ZnS:Mn film on the substrates 10.

In recent years, it has been desired that the CVD film having good qualities is grown in a large area of more than 100 cm². An apparatus which can produce such high quality CVD film at low cost and in large quantities is also desired. However, in order to realize the above desire, there are three problems to be overcome.

(1) Since the substrates become larger and heavier, a running lift can not be used and an accumulation on a reaction tube wall is attached to the substrate.

(2) If the horizontal reaction tube is made a large scale, convection of gas in up and down directions occurs meaningfully, so as to cause nonuniformity of deposited film thickness in up and down directions between two substrates or in the same substrate.

(3) A conventional vertical apparatus for a large area substrate cannot ensure a position where solid starting materials are placed.

SUMMARY OF THE INVENTION

The present invention provides a vapor deposition apparatus which can form a deposited film on large area substrates in large quantities. The vapor deposition apparatus of the present invention comprises:

a vertically-oriented main reaction tube having a top and a bottom, said main reaction tube having a gas vent at said bottom;

two horizontally-oriented branch reaction tubes connected to said top of the main reaction tube, each of said branch reaction tubes having a gas inlet at its free end; and heating means capable of controlling said main and branch reaction tubes to predetermined temperatures;

solid starting materials placed in said two branch reaction tubes; said substrates placed in said main reaction tube; carrier gas introduced into said branch reaction tubes at said gas inlets and exhausted from said main reaction tube at said gas vent at said predetermined temperature, such that said thin film is deposited on said substrates.

The present invention also provides a vapor deposition apparatus comprising:

a horizontally-oriented main reaction tube having a gas vent at one end;

two horizontally-oriented branch reaction tubes which are connected with a second end of said main reaction tube, each of said branch reaction tubes having a gas inlet at its free end; and heating means capable of controlling said main and branch reaction tubes to predtermined temperatures;

solid starting materials placed in said two branch reaction tubes; a container having pores on its top and bottom surfaces, said substrates being placed into said container and said container being placed in said main reaction tube; carrier gas introduced into said branch reaction tubes at said gas inlets and exhausted from said main reaction tube at said gas vent at said predetermined temperature, such that said thin film is deposited on said substrates.

In the apparatus of the present invention the direction of gas flow is up and down which is the same as the direction of gas convection, and therefore the effects of gas convection are so small that the film thickness in the up and down direction and impurity concentration are made uniform.

In the first embodiment, the substrates can be easily taken in or out through the bottom of the main reaction tube. In the second embodiment, the substrates are contained in a container which can be easily treated and protects the substrates from dust.

PREFERRED EMBODIMENT OF THE INVENTION

Embodiment 1

Figure 1:
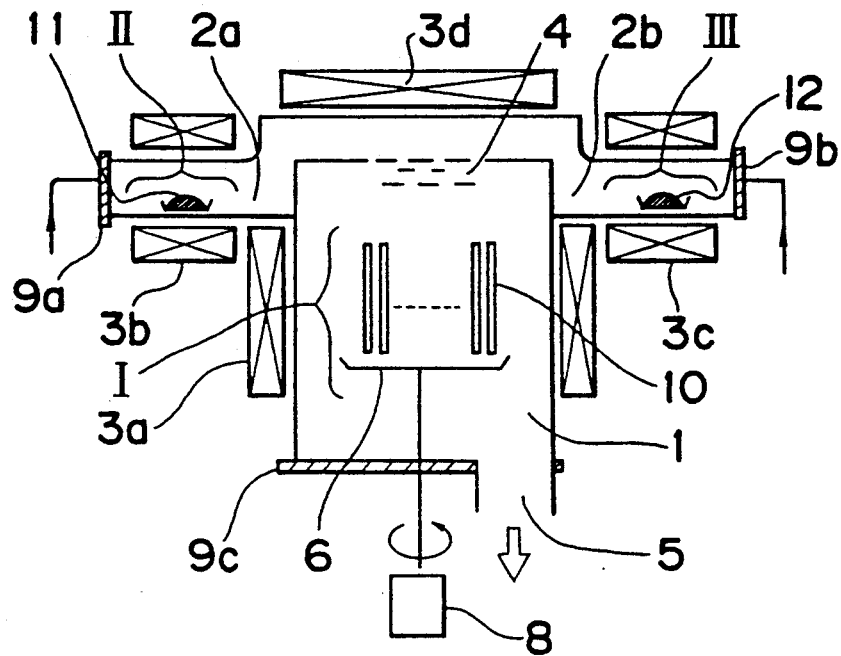
FIG. 1 schematically shows a sectional view of the first embodiment of the apparatus of the present invention.

An electroluminescence film (ZnS:Mn) is formed on a large area glass substrate using an apparatus as shown in FIG. 1.

In the apparatus, a main reaction tube 1 having an inside diameter of 28 cm and a height of 70 cm is vertically arranged and two branch reaction tubes 2a and 2b are horizontally connected with the upper portion of the main reaction tube 1. The main and branch reaction tubes 1, 2a and 2b are surrounded with electric furnaces 3a, 3b and 3c. Between the main reaction tube 1 and the branch reaction tube 2a and 2b, a baffle 4 is arranged and a furnace 3d is arranged thereover. An exhaust vent 5 is present at the bottom of the main reaction tube 1. A substrate holder 6 is arranged in the main reaction tube 1 and can be taken out from it. Solid starting materials are placed on solid starting material areas II and III which are present in the branch reaction tube 2a and 2b. The main reaction tube 1 and the branch reaction tube 2a and 2b are integrally made of quartz to constitute a reaction room. The holder 6 is connected with a motor 8 and can rotate during the reaction. Substrates 10 are put in order at a set spacing on the substrate holder 6 and placed in the main reaction tube 1 using a flange 9c for inserting and taking out the substrates 10. ZnS powder 11 and metal Mn 12 are respectively charged on quartz boards and placed in the solid starting material areas II and III using flanges 9a and 9b for inserting and taking out the solid starting material.

Two glass substrates of 6 inches size (170×140 mm) are piled to form one pair. Ten pairs of the glass substrates are placed on the holder 6. Hydrogen gas flows in the branch reaction tube 2a which is heated to 900° to 1,000° C., and transfers ZnS into the main reaction tube 1. Hydrogen chloride gas flows in the branch reaction tube 2b which is heated to 800° to 900° C., and transfers Mn into the main reaction tube 1. The main reaction tube 1 is deaerated by a mechanical pump and an oil rotating pump to keep at 60 mm torr. The growing rate of the deposited film is adjusted to 50 to 200 A/min by controlling a flow rate of hydrogen gas, and a concentration of Mn is adjusted to 0.3 to 0.6 at % by controlling a ratio of flow rate of hydrogen gas and hydrogen chloride gas.

Figure 4:
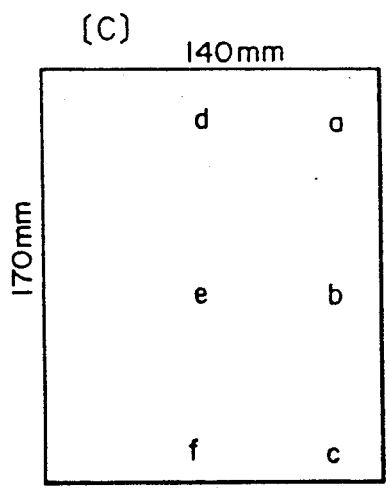
FIG. 4 shows the distribution of deposited film thickness and Mn concentration in the same substrate.
Figure 5:
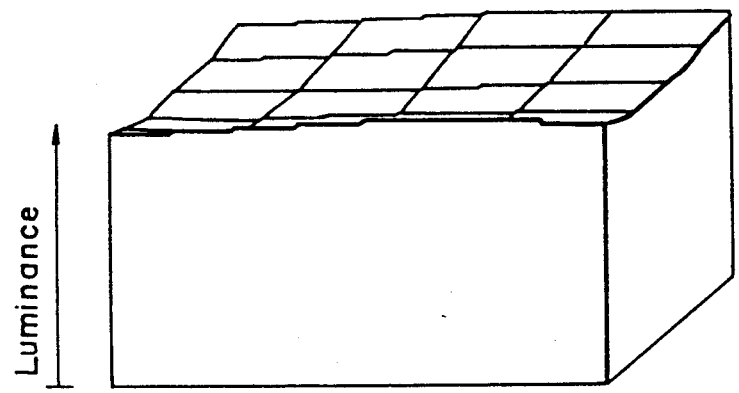
FIG. 5 shows a luminance of the deposited substrate as EL panel.

The deposited ZnS:Mn film was subjected to evaluation of the distribution of film thickness and Mn concentration in the same substrate and the results are shown in FIG. 4 (A), (B) and (C). The film thickness measured by a surface roughness meter had a distribution within 2% and therefore was very uniform. The Mn concentration increased as approaching the periphery of the substrate and had a distribution of ±10%. The evaluation was also made between the substrates and found to be very small distribution. The deposited substrate was employed as EL panels and its luminance in the surface was measured to find very uniform as shown in FIG. 5. For practical use the luminance distribution of Min/Max in the surface is required to be 70% or more, and the obtained EL display of this present invention meets the requirement. Even if 50 substrates were employed, sufficient uniformity was kept. The apparatus of the present invention thus has excellent mass-producibility. In the conventional horizontal vapor deposition apparatus, the Mn concentration distribution and film thickness distribution exhibited nonuniformity in up and down directions. Also, in the conventionally produced substrates luminance distribution showed asymmetrical surface distribution in up and down directions, but such unsymmetrical distribution does not occur in the apparatus of the present invention.

The solid starting materials (ZnS and Mn) should be resupplied after each cycle, but the supplementation can be easily done using the flanges 9a and 9b. Although the reaction tube has a complicated shape, no problems in strength are present and the apparatus exhibits very good quality even after 100 cycles.

In the apparatus of the present invention, since the starting material areas are separated from each other, a furnace temperature can be separately controlled.

Embodiment 2

Figure 2:
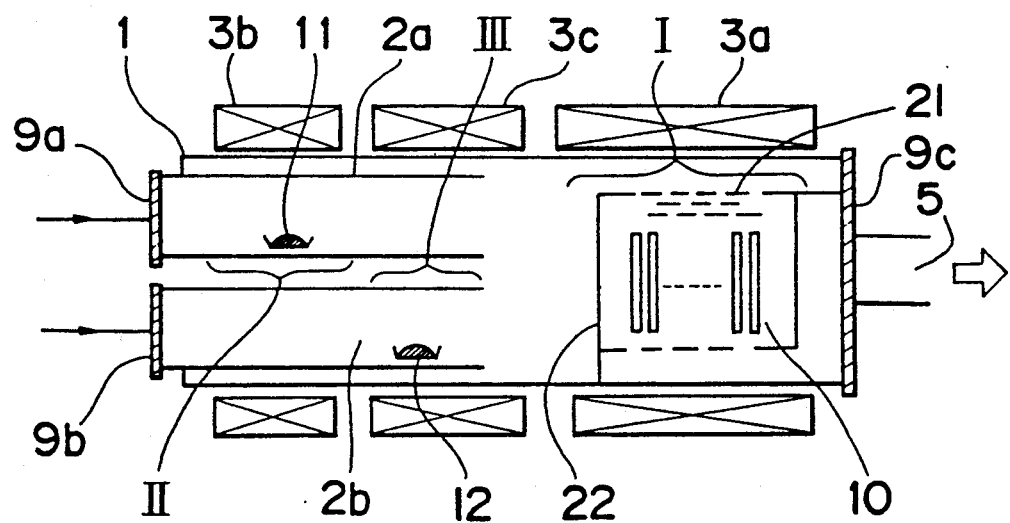
FIG. 2 schematically shows a sectional view of the second embodiment of the apparatus of the present invention.
Figure 3:
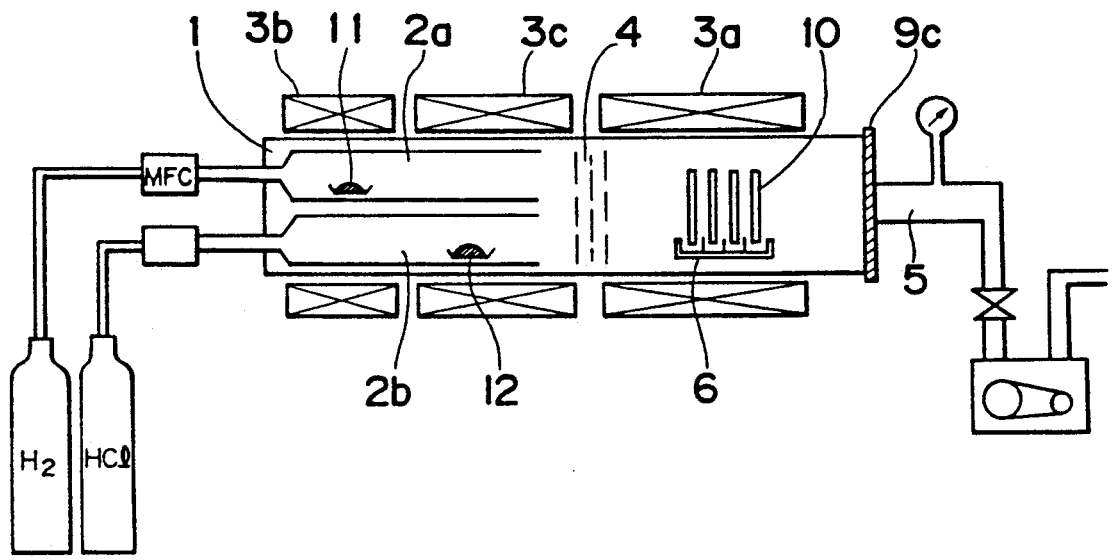
FIG. 3 schematically shows a sectional view of the conventional apparatus.

An electroluminescence film (ZnS:Mn) is formed on a large area glass substrate using an apparatus as shown in FIG. 2.

The apparatus comprises a main reaction tube 1 which is horizontally arranged, and two branch reaction tubes 2a and 2b which are horizontally connected with the main reaction tube 1. Around the reaction tube 1, three furnaces 3a, 3b and 3c are arranged, and a substrate area I consists of a quartz substrate container 22 of which the top and bottom surface have pores 21. Substrates 10 are contained in the container 22 and transferred within the container 22. AS gas is exhausted through an air vent 5, the starting material gas flows vertically near the substrates 10.

By using the above apparatus, a deposited film (ZnS:Mn) was prepared on the substrates the film was found to be uniformly formed on a large number of substrate.

The above embodiments discuss the formation of ZnS:Mn film, but the apparatus can be used for ZnS:Tb, ZnS:Sm, CaS:Eu, SrS:Ce or a III-V group compound (GaAs) and Si, and impurity doping thereto. The apparatus of the present invention can be useful for producing a large area thin film in large quantities.

What is claimed is:

1. A vapor deposition apparatus for depositing an electroluminescent film on a plurality of substrates, comprising:

a vertically-oriented main reaction tube having a top and a bottom, said main reaction tube having a gas vent at said bottom, the plurality of substrates being vertically oriented within said main reaction tube;

two horizontally-oriented branch reaction tubes connected to said top of the main reaction tube, each of said branch reaction tubes containing a solid starting material and having a gas inlet at its free end;

a baffle arranged between said main reaction tube and said branch reaction tubes; and heating means for heating said main and branch reaction tubes;

wherein carrier gas introduced into said branch reaction tubes at said gas inlets is mixed by said baffle arrangement and vertically transported over said plurality of vertically oriented substrates and exhausted from said main reaction tube at said gas vent such that deposition of said film on said plurality of substrates is by the vertical flow of said mixed carrier gas.

2. The apparatus according to claim 1 wherein said plurality of substrates are supported on a substrate holder which is rotatable during deposition.

3. The apparatus according to claim 2 wherein said plurality of substrates are in order at a set spacing on said substrate holder.

4. The apparatus according to claim 1 wherein said heating means are electric furnaces surrounding said main and branch reaction tubes.

5. The apparatus according to claim 1, wherein said baffle arrangement includes layers of offset openings through which said carrier gas passes to mix the same.

* * * * *